(12) United States Patent
Henderson

(10) Patent No.: US 9,229,492 B2
(45) Date of Patent: Jan. 5, 2016

(54) ADAPTIVE INFORMATION HANDLING SYSTEM RACK RAIL MOUNT

(71) Applicant: Dell Products L.P., Round Rock, TX (US)

(72) Inventor: Gregory L. Henderson, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 275 days.

(21) Appl. No.: 13/654,926

(22) Filed: Oct. 18, 2012

(65) Prior Publication Data

US 2014/0111930 A1 Apr. 24, 2014

(51) Int. Cl.
| | |
|---|---|
| G06F 1/16 | (2006.01) |
| A47B 88/04 | (2006.01) |
| B23P 11/00 | (2006.01) |
| G06F 1/18 | (2006.01) |

(52) U.S. Cl.
CPC ............... *G06F 1/181* (2013.01); *G06F 1/183* (2013.01); *Y10T 29/49826* (2015.01)

(58) Field of Classification Search
USPC ............ 361/679.02, 724, 679.58, 726, 727, 361/679.4, 725, 796, 825; 211/26.2, 175, 211/190, 191, 162, 192; 312/223.2, 334.5, 312/223.1, 334.4, 334.1, 265.1, 301, 319.1, 312/321, 330.1, 333, 334.8; 29/428; 248/298.1, 200, 205.1, 220.21, 222.11, 248/239, 309.1, 575, 674
See application file for complete search history.

(56) References Cited

U.S. PATENT DOCUMENTS

| | | | |
|---|---|---|---|
| 5,833,337 A * | 11/1998 | Kofstad | 312/334.5 |
| 6,181,549 B1 * | 1/2001 | Mills et al. | 361/679.59 |
| 6,305,556 B1 * | 10/2001 | Mayer | 211/26 |
| 6,422,399 B1 | 7/2002 | Castillo et al. | |
| 6,554,142 B2 | 4/2003 | Gray | |
| 6,659,577 B2 | 12/2003 | Lauchner | |
| 6,666,340 B2 | 12/2003 | Basinger et al. | |
| 6,830,300 B2 | 12/2004 | Lauchner | |
| 6,840,388 B2 | 1/2005 | Mayer | |
| 6,891,727 B2 | 5/2005 | Dittus et al. | |
| 7,168,576 B2 * | 1/2007 | Williams | 211/26 |
| 7,192,103 B2 | 3/2007 | Hamilton | |
| 7,255,409 B2 | 8/2007 | Hu et al. | |
| 7,284,672 B2 | 10/2007 | Tsai | |
| 7,357,362 B2 | 4/2008 | Yang et al. | |
| 7,731,142 B2 | 6/2010 | Chen et al. | |
| 7,740,329 B2 * | 6/2010 | Hsiung et al. | 312/334.4 |
| 7,780,253 B1 | 8/2010 | Lu | |
| 7,798,582 B2 | 9/2010 | Yu et al. | |

(Continued)

*Primary Examiner* — Robert J Hoffberg
*Assistant Examiner* — Michael Matey
(74) *Attorney, Agent, or Firm* — Terrile, Cannatti, Chambers & Holland, LLP; Robert W. Holland

(57) ABSTRACT

A rail adjustable mount adjusts a rail to support information handling system chassis with different depths in racks of different depths. The adjustable mount couples to a rack front with a sliding portion extending into the rack interior. The adjustable mount sliding portion slidingly engages a guide of the rail to allow adjustment of the rail relative to the rack so that a rail fits into a rack having a depth that is greater than the length of the rail's housing. A floating portion of the rail supports the rail at the rear of the rack and allows the rail position to float relative to the rear of the rack. A biasing device of the adjustable mount biases the rail towards the front of the rack to aid full extension and retraction of the rail at the rack.

17 Claims, 6 Drawing Sheets

(56) References Cited

U.S. PATENT DOCUMENTS

| | | |
|---|---|---|
| 7,857,145 B2 | 12/2010 | Mushan et al. |
| 7,878,468 B2 | 2/2011 | Chen et al. |
| 7,950,753 B2 | 5/2011 | Liang |
| 7,992,950 B2 | 8/2011 | Lauchner |
| 8,104,851 B2 | 1/2012 | Lu |
| 8,403,434 B2 | 3/2013 | Yu et al. |
| 8,562,086 B1 | 10/2013 | Baik et al. |
| 8,596,471 B2 | 12/2013 | Chen et al. |
| 2003/0026084 A1* | 2/2003 | Lauchner ............ 361/826 |
| 2003/0106863 A1 | 6/2003 | Lauchner et al. |
| 2003/0107309 A1 | 6/2003 | Lauchner |
| 2003/0234602 A1 | 12/2003 | Cutler et al. |
| 2004/0041502 A1 | 3/2004 | Lauchner |
| 2004/0056155 A1* | 3/2004 | Chen et al. ............ 248/49 |
| 2004/0079712 A1* | 4/2004 | Mayer .................. 211/26 |
| 2004/0104184 A1 | 6/2004 | Hartman et al. |
| 2005/0052102 A1 | 3/2005 | Lauchner |
| 2005/0156493 A1 | 7/2005 | Yang et al. |
| 2005/0285492 A1 | 12/2005 | Hu et al. |
| 2005/0285493 A1 | 12/2005 | Hu et al. |
| 2007/0247044 A1 | 10/2007 | Adams et al. |
| 2008/0067907 A1 | 3/2008 | Chen et al. |
| 2008/0087781 A1 | 4/2008 | Chen et al. |
| 2008/0296455 A1 | 12/2008 | Brock et al. |
| 2009/0114785 A1* | 5/2009 | Huang et al. ............ 248/220.31 |
| 2009/0166485 A1* | 7/2009 | Chen et al. .............. 248/200 |
| 2009/0167127 A1 | 7/2009 | Chen et al. |
| 2009/0219701 A1* | 9/2009 | Wu et al. ................ 361/727 |
| 2010/0032389 A1* | 2/2010 | Du et al. ................. 211/26 |
| 2010/0033926 A1* | 2/2010 | Du et al. ................. 361/679.58 |
| 2010/0140195 A1 | 6/2010 | Henderson et al. |
| 2010/0200523 A1 | 8/2010 | Henderson |
| 2010/0243586 A1* | 9/2010 | Henderson et al. ....... 211/26.2 |
| 2011/0111686 A1 | 5/2011 | Hruby et al. |
| 2011/0181161 A1 | 7/2011 | Hsiao |

\* cited by examiner

ADAPTIVE INFORMATION HANDLING SYSTEM RACK RAIL MOUNT

BACKGROUND OF THE INVENTION

1. Field of the Invention

The present invention relates in general to the field of information handling system mounts, and more particularly to an adaptive information handling system rack rail mount.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are often configured to handle anticipated functions and workloads. As an example, server information handling systems have evolved over time to include availability of an increased density of features and components, especially in mid-range and high-end products. Server information handling systems are often maintained in rack enclosures that vertically stack information handling systems on sliding rails. The height and width of server information handling systems that reside in standard-sized racks are set by the EIA-310-E standard. Typically, information handling systems are designed to have dimensions defined by the number of standardized U that the system has for its height and width. A typical full-size rack has from 42 to 48 U of space for supporting information handling systems and related equipment, such as power supplies and network communications gear.

Although standard sized racks constrain the height and width of server information handling systems, the depth of a rack can vary to allow larger information handling system chassis modules, such as to accommodate additional and/or larger components. If a rack has too great a depth for an information handling system chassis module, such as where a server information handling system is de-featured for a lower-end product offering, the shorter chassis leaves an empty space at the back of the rack when it is slid into the rack interior on its rails. In order to accommodate different chassis and different rack sizes, manufacturers typically have to design rails with different lengths and different connections to the chassis. For example, the rail has to have a length that couples to the front and rear mounting flanges in the rack and either the rail or the chassis has to adjust a coupling point so that the chassis rests at the front of the rack in a closed position with the rails retracted to the rack interior.

Providing different rails for racks and/or information handling systems of different depths can present a substantial logistics problem for information handling system manufacturers and information technology administrators. Although an optimized rail solution may exist for each variation of rack and chassis depth, development and inventory costs for providing multiple rail solutions make this approach inefficient. For example, different types of rails increase the complexity of ordering rails for a given chassis and rack, and increases the risk that an incorrect rail will be delivered to an end user. As another example, deployment and re-deployment of information handling systems to an established data center with existing racks presents increased complexity if installed rails do not work with newly ordered information handling systems. The cost of manufacturing increases if multiple types of rails are produced, as compared with efficiencies available if more rails of a particular type are ordered. In addition, inventory overhead costs are increased with an increased number of rail types that have to be tracked by unique part numbers and maintained in sufficient numbers to timely fill product orders. Instead of providing plural rails types, a manufacturer could design a single rail kit to accommodate the deepest system in a "U" family to make all shorter systems fit by default. However, this penalizes shorter systems by forcing them to use rails that are longer than required and thereby artificially constrains the number and type of racks in which the shorter systems will fit.

SUMMARY OF THE INVENTION

Therefore a need has arisen for a system and method which provides a common rail assembly to accommodate information handling system racks and chassis of different depths.

In accordance with the present invention, a system and method are provided which substantially reduce the disadvantages and problems associated with previous methods and systems for disposing information handling systems on rails that slide into and out of a rack. An adjustable mount couples a rail to a rack to allow the rail to move relative to the rack. The adjustable mount allows the rail to fit into racks of different depths and to fully extend and retract information handling system chassis of different depths into and out of the rack.

More specifically, plural information handling system chassis are disposed on parallel opposing rails in a rack to process information, such as with a processor and memory interfaced through a circuit board. An adjustable mount couples each rail to the front of the rack to allow the rail to slide relative to the front of the rack. The adjustable mount effectively varies the length of the rail to allow one rail size to fit in plural rack depths, and to allow chassis of different depths to operate in the rack. A chassis having a shorter depth, such as a depth of not more than the length of the rail, will extend and retract using the sliding portion of the rail without movement of the rail relative to the rack by the adjustable mount, such as with only the normal telescoping motion of the rail assembly. A chassis having a longer depth, such as a depth of greater than the length of the rail, will have full retraction into the rack and extension from the rack provided in part by motion of the rail with the adjustable mount relative to the front of the rack. When a chassis has a depth of greater than the rail length and up to the maximum depth supported by its brackets, the normal telescoping motion of the rail reaches its travel limit before the chassis is fully retracted into the rack. To allow full retraction, the rail moves backwards with the adjustable mount from the front of the rack towards the rear to accommodate additional chassis depth. A biasing device biases the rails towards the front of the rack so that the rails move forward as the chassis is extended from the rack to provide full chassis extension from the rack.

The present invention provides a number of important technical advantages. One example of an important technical advantage is that a self-adjusting rail mounting bracket automatically adapts a rail for systems of varying depth. The self-adjusting rail mounting bracket replaces a fixed mounting bracket on any existing rail to adjust the existing rail to fit systems having an increased depth. A rail equipped with a self-adjusting mounting bracket will look and behave like a short rail for use with shallower systems while automatically converting to look and behave like long rails for deeper systems. Having one rail that adapts to plural rack depths simplifies design, manufacture and inventory associated with the rail relative to the use of multiple rails. End users face less confusion in ordering rails and in assembly of rails into racks. Further, once a rack has rails assembled, redeployment to the rack of different information handling systems is more easily accomplished without having to change the rails. Self-adjustment of a rail by an adjustable mount is completely passive to allow a single rail kit to convert between short and long chassis usage without user interaction or adjustments. Rails are effectively future proofed by enabling a large range of allowable chassis depths and greater flexibility in future chassis designs.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An adjustable mount couples a rail in a rack to adapt the rail to racks and information handling system chassis of varying depth. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
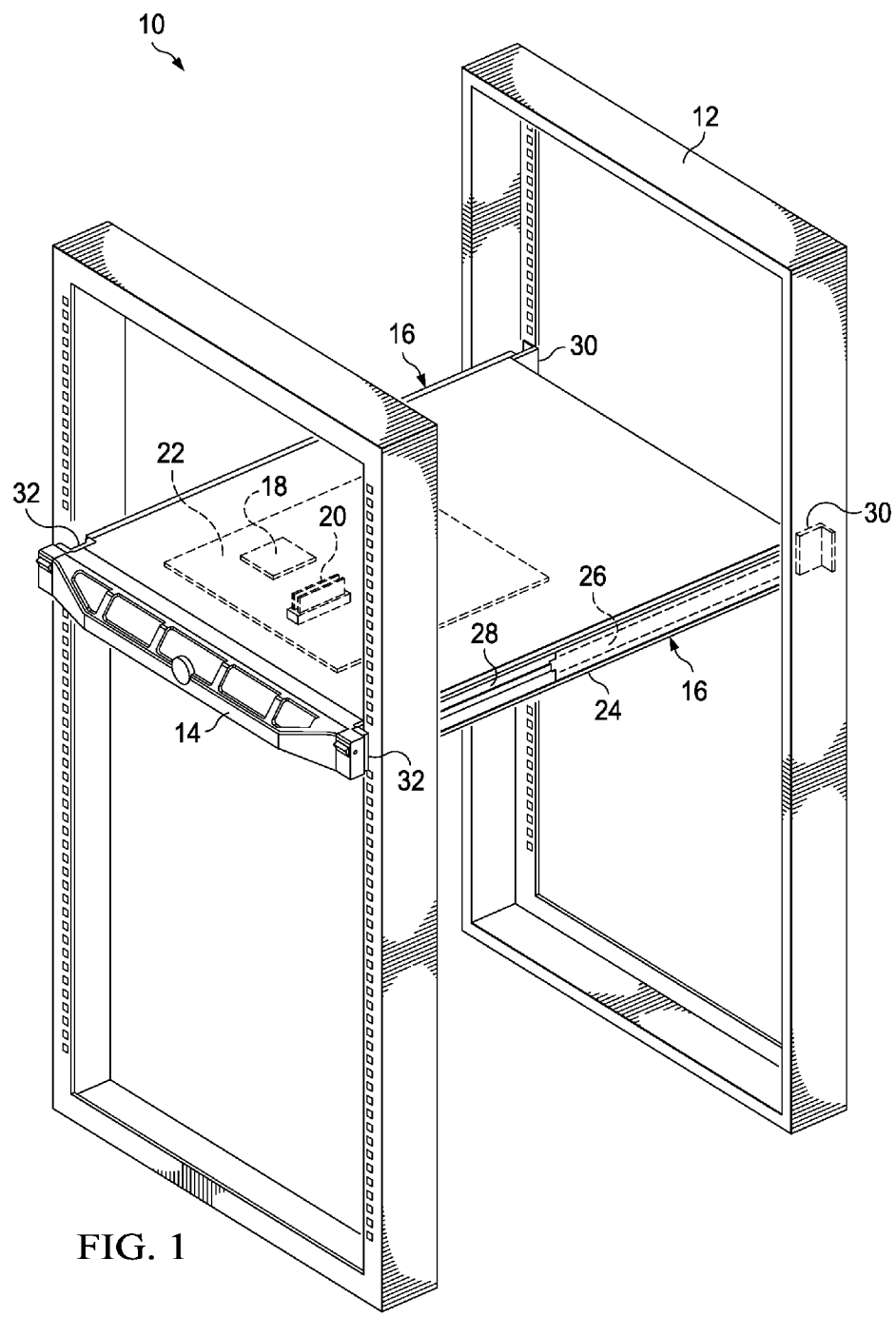
FIG. 1 depicts an information handling system having a rack that holds plural information handling system chassis on sliding rails.

Referring now to FIG. 1, an information handling system 10 is depicted having a rack 12 that holds plural information handling system chassis 14 on sliding rails 16. For example, each information handling system chassis 14 is a server information handling system module having a processor 18 and random access memory (RAM) 20 disposed on a circuit board 22. During information processing, a chassis 14 slides into the interior body of rack 12 on rails 16 disposed on opposing sides of rack 12. If maintenance or replacement of a chassis 14 is required, the chassis 14 is slid on opposing rails 16 out of the interior of rack 12 for access by an end user. In one example embodiment, rack 12 has standard dimensions that accept up to forty-four 1 U chassis 14. In alternative embodiments, racks of various dimensions and orientations may be used.

Rail 16 has a conventional structure with a rail housing 24 that contains a telescoping portion 26 that slides into and out of rail housing 24. Telescoping portion 26 includes a chassis mount 28 that couples to information handling system chassis 14. During normal operations, rail 16 retracts sliding portion 26 into rail housing 24 to retract a chassis 14 coupled at chassis mount 28 into the interior of rack 12. An end user accesses information handling system chassis 14 by pulling chassis 14 from the interior of rack 12 to slide telescoping portion 26 relative to rail housing 24 out of the front of rack 12. Rail housing 24 couples to the rear of rack 12 with a floating portion 30, such as a conventional rear mounting bracket that floats to accommodate variances in mounting flange spacing among different rack manufacturers. Rail housing 24 couples to the front of rack 12 with an adjustable mount 32 that adjusts rail housing 24 to couple in chassis of varying depth. As an information handling system chassis 14 is slid out the front of rack 12, adjustable mount 32 adjusts the position of rail housing 24 relative to rack 12 to provide complete extraction of chassis 14. As an information handling system chassis 14 is slid into the front of rack 12 towards the rear of rack 12, adjustable mount 32 adjusts the position of rail housing 24 relative to rack 12 to provide complete retraction of chassis 14 into rack 12.

Figure 2:
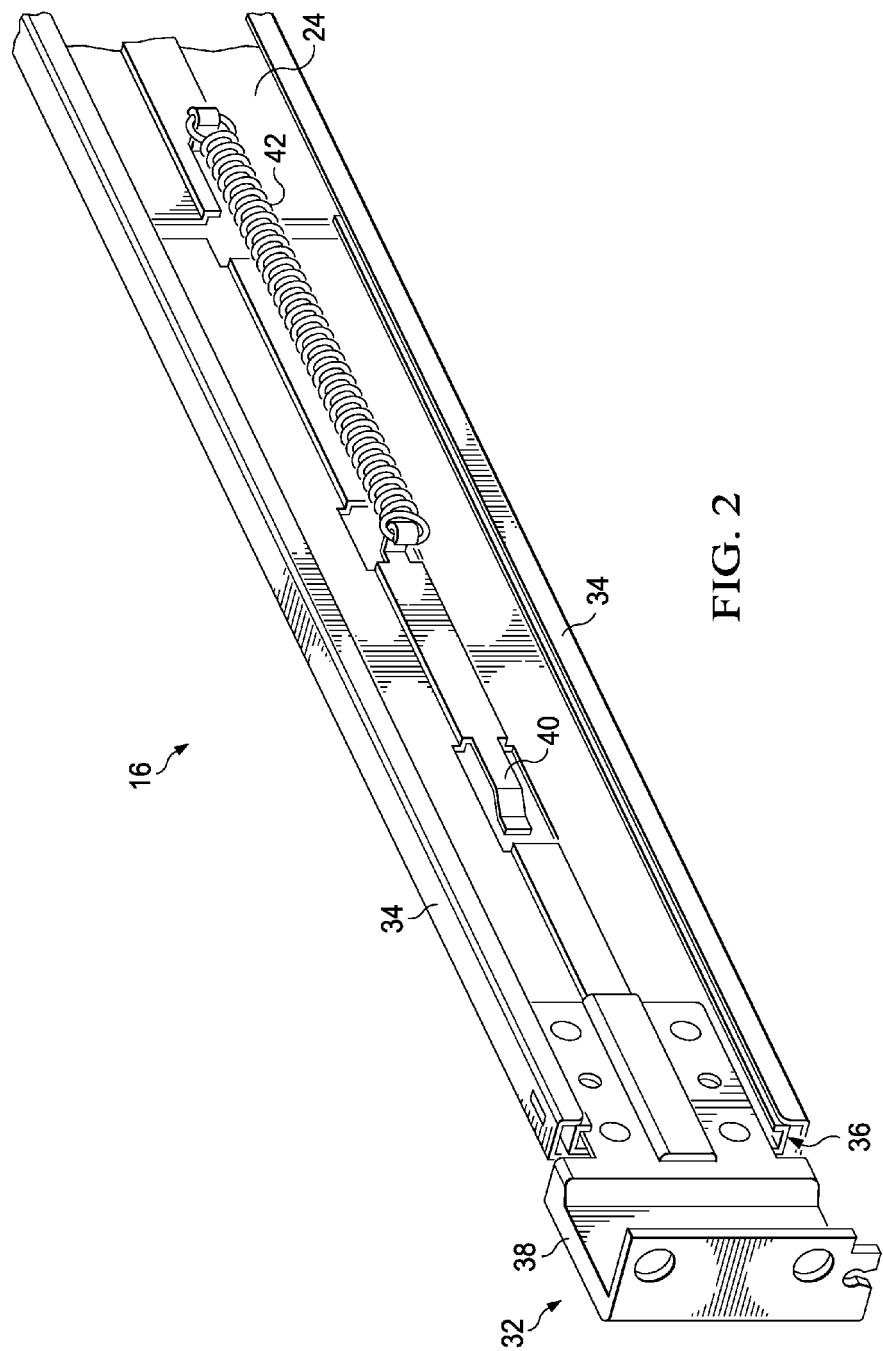
FIG. 2 depicts a side view of an adjustable mount coupled to the fixed outer side of a rail housing of a rail.

Referring now to FIG. 2, a side view depicts an adjustable mount 32 coupled to the fixed outer side of a rail housing 24 of rail 16. Rail housing 24 has a guide 34 coupled to or integrated with its side length along the side that faces away from information handling system chassis 14 and rail telescoping portion 26 and towards rack 12. Guide 34 accepts a sliding portion 36 of adjustable mount 32 in a sliding manner that adjusts the position of a mounting portion 38 of adjustable mount 32 relative to rail housing 24. Adjustable mount 32 moves relative to rail housing 24 in a manner that is independent of the movement of sliding portion 26 contained by rail housing 24. Adjustable mount sliding portion 36 extends outward from guide 34 to effectively increase the length of rail 16 so that rail 16 can adjust to chassis 14 of different depth. At a chassis 14 of minimum depth for rail 16, mounting portion 38 fully inserts sliding portion 36 into guide 34 as depicted by FIG. 2. A chassis 14 of maximum depth for rail 16, sliding portion 36 slides out of guide 34 until its motion is stopped by a travel stop 40. A biasing spring 42 couples between adjustable mount 32's sliding portion 36 and rail housing 24 to bias mounting portion 38 against rail housing 24.

Figure 3:
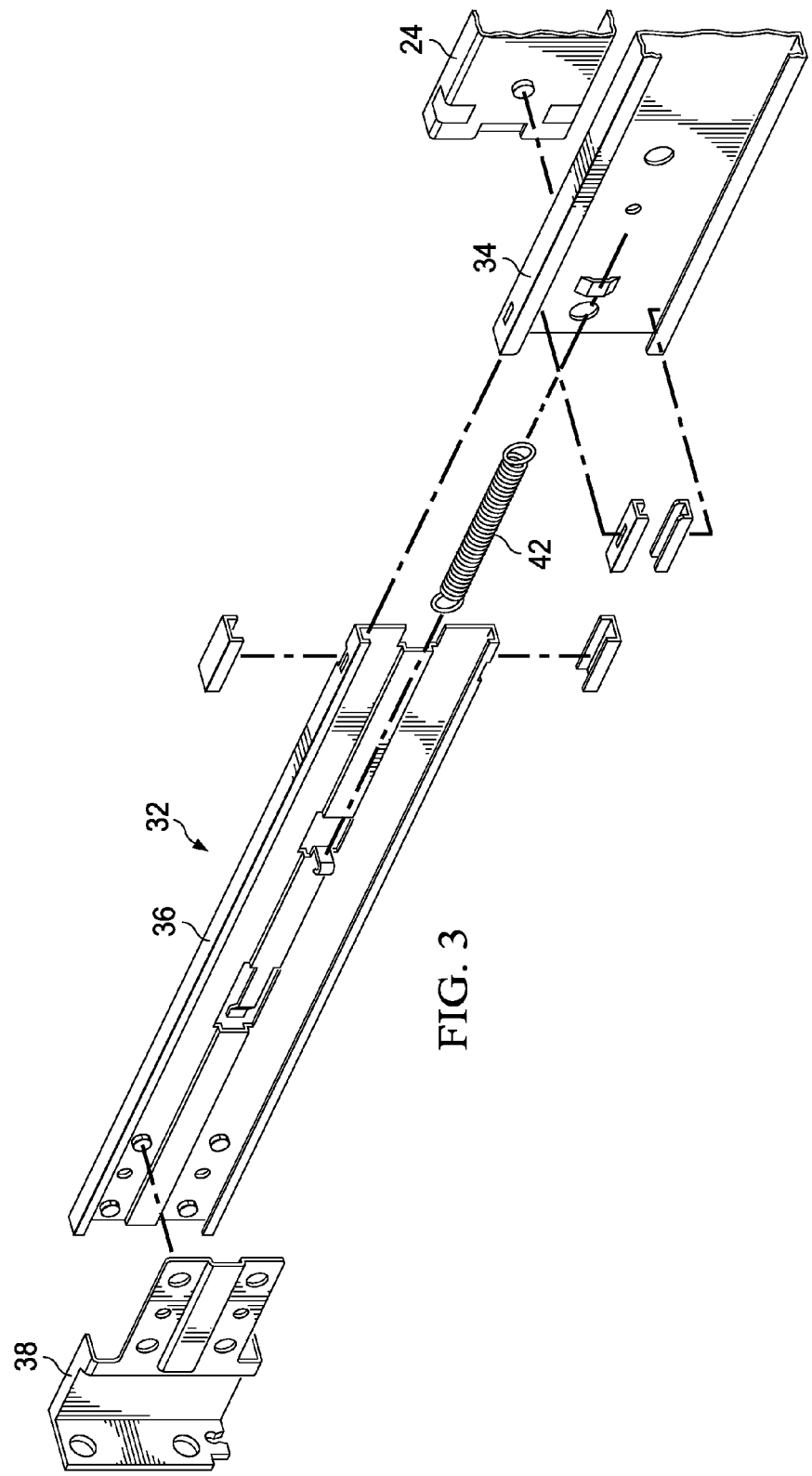
FIG. 3 depicts a blow-up view of an adjustable mount disassembled.

Referring now to FIG. 3, a blow-up view depicts adjustable mount 32 disassembled. Guide 34 disposed on the fixed outer side of rail housing 24 has an upper and lower portion that accept sliding portion 36. Mounting portion 38 is biased towards rail housing 24 by biasing spring 42. In alternative embodiments, alternative structures can provide an adjustable mount, such as a rod that extends from mounting portion 38 that interacts with an unthreaded opening of rail 16. In alternative embodiments, adjustable mount 32 may be integrated to rail 16 at locations other than the side opposite of that at which information handling system chassis 14 mounts. Although floating portion 30 may have a conventional structure for coupling at the rear of rack 12, in alternative embodiments, floating portion 30 may have a structure similar to adjustable mount 32 with varying amounts of bias to encourage either the front or back sliding portion to move first when a force is applied from rail housing 24.

Figure 4:
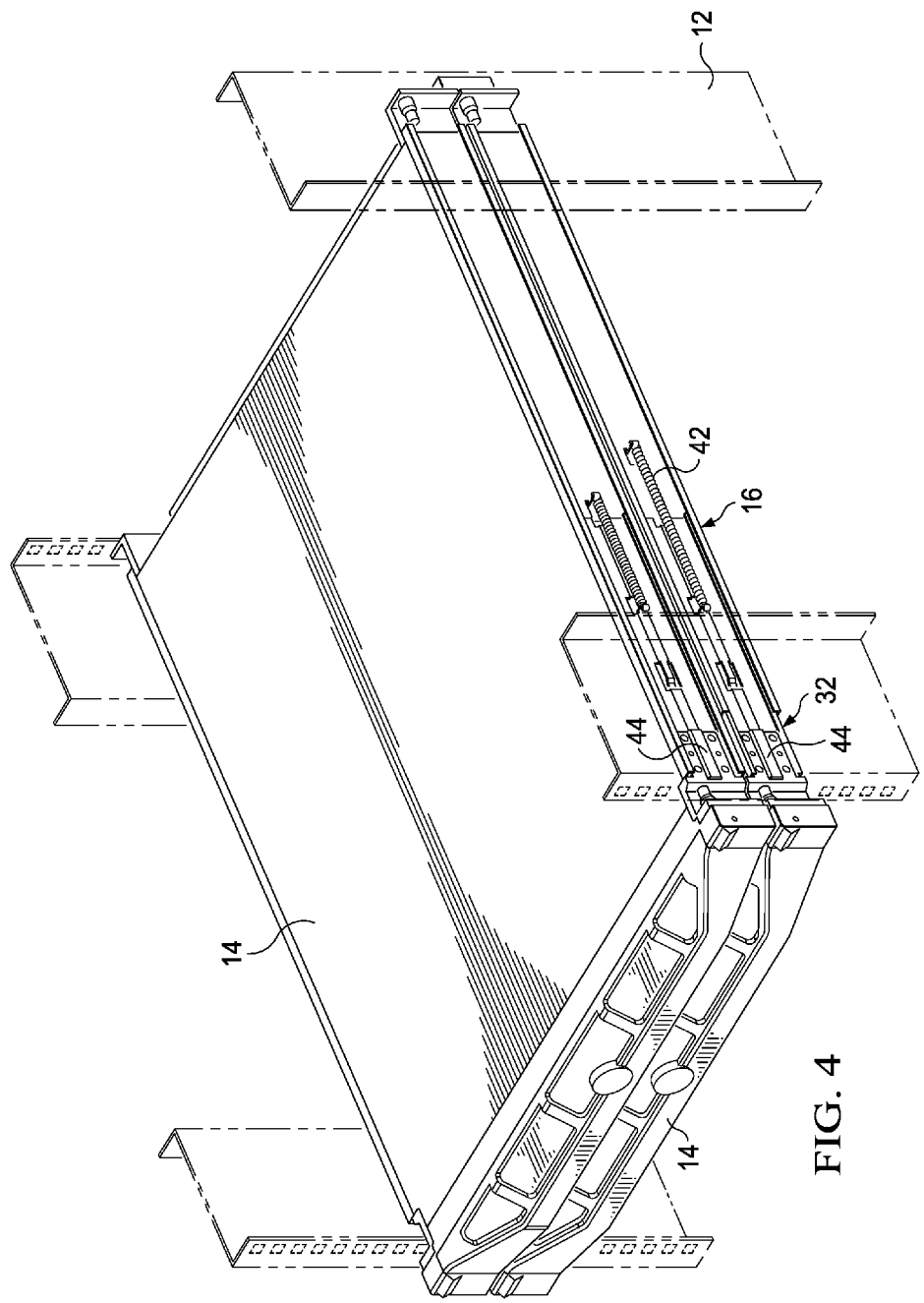
FIG. 4 depicts a side perspective view of long and short information handling system chassis retracted into a rack with rails having an adjustable mount.

Referring now to FIG. 4, a side perspective view depicts long and short information handling system chassis 14 retracted into a rack 12 with rails 16 having an adjustable mount 32. The short chassis 14 is disposed over the long chassis 14 with both chassis 14 pushed into rack 12 to a fully retracted position. Short chassis 14 in the upper position retracts fully into rack 12 with the telescoping action of rail 16 telescoping portion 26 so that rail 16 remains fully forward at the front of rack 12 under the influence of biasing spring 42. Long chassis 14 below short chassis 14 also retracts fully into rack 12. However, long chassis 14 uses all of the telescoping motion of rail 16 telescoping portion 26 before the long chassis 14 is completely retracted into rack 12. Once telescoping portion 26 has fully retracted into rail 16 housing 24, pushing long chassis 14 further into rack 12 overcomes the biasing force of biasing spring 42 to push rail 16 backwards and away from the front of rack 12, leaving the portion noted as rail motion 44 exposed for adjustable mount 32 sliding portion 36. The total motion 44 of rail 16 away from the front of rack 12 depends upon the depth of chassis 14 once chassis 14 reaches full retraction into rack 12. In one example embodiment, a chassis 14 having a depth of not greater than the length of rail 16 in an unextended position can fully extend and retract with only the telescoping portion 26 of rail 16 so that movement of the rail 16 relative to the rack 12 is not necessary. In another embodiment, a chassis 14 having a depth of greater than the length of rail 16 in an unextended position obtains full retraction into rack 12 with movement of rail 16 relative to rack 12. In alternative embodiments, alternative configurations may be used with varying rail lengths and chassis depths. For example, different adjustable mounts 32 with sliding portions 36 of different lengths can be used to adapt a common rail 16 to chassis having different depths.

Figure 5:
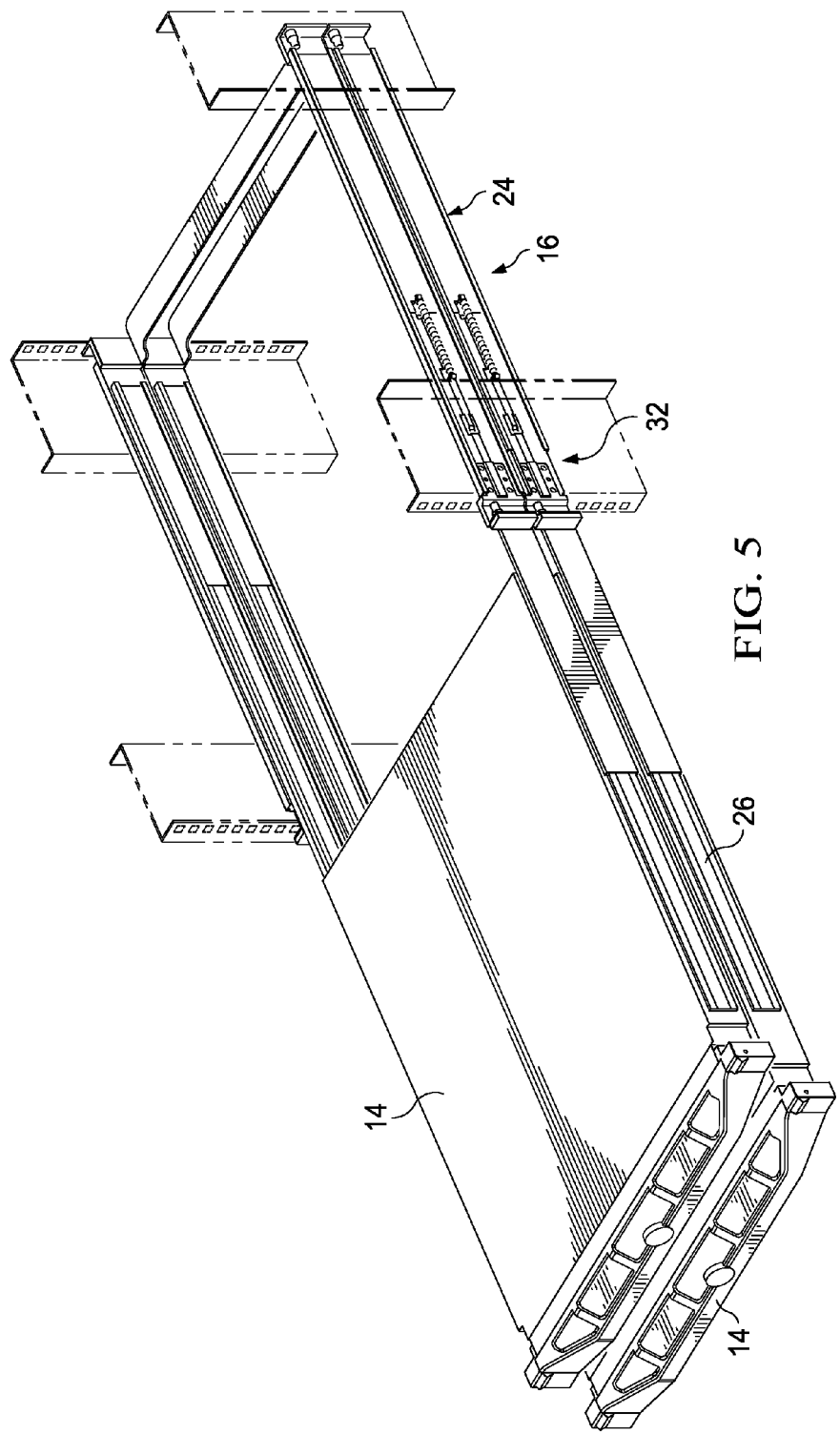
FIG. 5 depicts a side perspective view of long and short information handling system chassis extended from a rack with rails having an adjustable mount.

Referring now to FIG. 5, a side perspective view depicts long and short information handling system chassis 14 extended from a rack 12 with rails 16 having an adjustable mount 32. Long chassis 14 disposed below short chassis 14 extends a greater distance out of rack 12 to allow an end user to have full access to the entire length of chassis 14. Both the long and short chassis 14 extend outwards the full motion of the telescoping portion 26 of rail 16 with adjustable mount 32 having rail housing 24 extended fully forward against the front of rack 12. In the fully extended positions, long chassis 14 is further forward than short chassis 14. Having full extension of both chassis 14 entirely out of rack 12 allows end user access; having full retraction of both chassis 14 into rack 12 with the action of adjustable mount 32 allows a rack 12 to support chassis of different depths using rails 16 having a common length.

Figure 6:
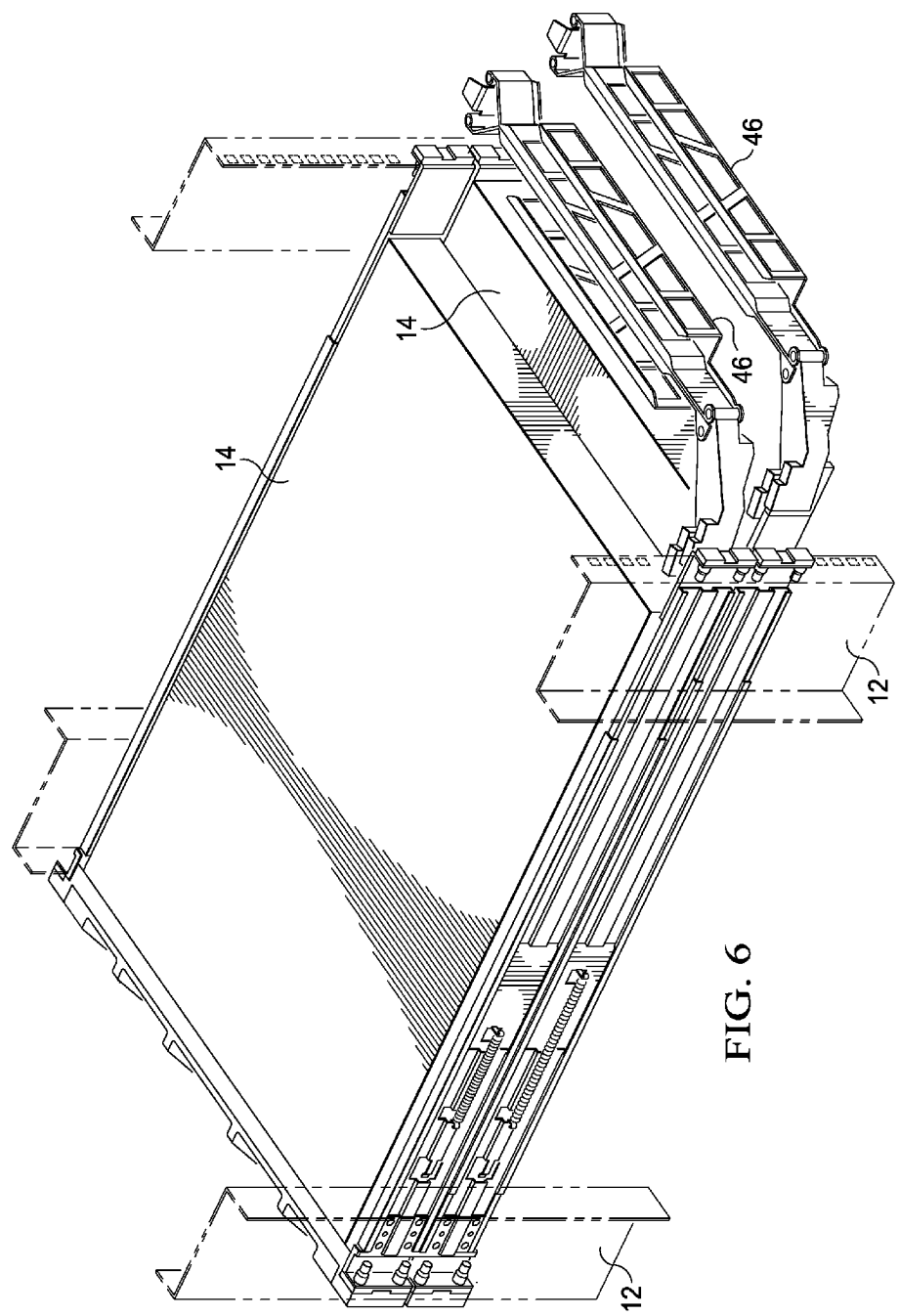
FIG. 6 depicts a rear perspective view of cable managers cooperatively coupled to rails supported by an adjustable mount.

Referring now to FIG. 6, a rear perspective view depicts cable managers 46 cooperatively coupled to rails 16 supported by an adjustable mount 32. Self-adjustment of rail 16 with adjustable mount 32 allows as common cable manager 46 to be used in information handling system chassis 14 having varying depth. When a short chassis 14 is mounted in rack 12 with an adjustable mount 32, cable manger 46 extends and retracts normally in a conventional manner as telescoping portion 26 moves the short chassis 14 in and out of rack 12 without moving rail 16 relative to rack 12. When a long chassis 14 is mounted in rack 12, self-adjustment by adjustable mount 32 allows cable manager 46 to translate as a unit with rail 16 when rail 16 retracts or extends by adjustable mount 32 to accommodate extras chassis depth. Moving cable manager 46 with rail 16 requires less extension of cables by cable manger 46 so that a common cable manger 46 will work with both a long and a short chassis 14 since the extension range of the cable manager does not vary based upon chassis depth.

Although the present invention has been described in detail, it should be understood that various changes, substitutions and alterations can be made hereto without departing from the spirit and scope of the invention as defined by the appended claims.

What is claimed is:

1. An information handling system comprising:
a rack having opposing sides to support plural opposing sets of rails, the plural opposing sets of rails disposed on the rack, each of the plural opposing sets of rails having an opposing set of rails on the opposing sides of the rack;
at least one information handling system chassis supported by the opposing set of rails by coupling to each opposing rail of the opposing set of rails, the at least one information handling system chassis having a processor and memory interfaced through a circuit board to process information, the opposing set of rails operable to slide the at least one information handling system chassis between an interior and an exterior of the rack; and
an adjustable mount coupled to each rail of the opposing set of rails to mount each rail of the opposing set of rails to the rack, each adjustable mount coupled to the rack and to a respective one of the rails to provide movement of the respective one of the rails relative to the rack to have:
a first position corresponding to a fully retracted position with the rack of a respective one of the at least one information handling system chassis having a minimum depth;
a second position corresponding to the fully retracted position with the rack of a respective one of the at least one information handling system chassis having a depth greater than the minimum depth;
wherein the adjustable mount biases to the first position to a maintain constant position of each rail relative to a corresponding one of the adjustable mount during movement of the respective one of the at least one information handling system chassis having the minimum depth as the respective one of the at least one information handling system chassis having the minimum depth slides from an extended position outside of the rack to the first position;
wherein the adjustable mount biases to the first position to maintain constant position of each rail relative to the corresponding one of the adjustable mount during movement of the respective one of the at least one information handling system chassis having the depth greater than the minimum depth as the respective one of at least one information handling system chassis having the depth of greater than the minimum depth slides from the extended position outside of the rack towards the first position, the corresponding one of the adjustable mount overcoming the bias permitting movement of each rail relative to the corresponding one of adjustable mount as the respective one of the at least one information handling system having the depth of greater than the minimum depth passes the first position towards the second position to move the respective one of the rails relative to the adjustable mount.

2. The information handling system of claim 1 wherein each adjustable mount further comprises:
   a mounting portion coupled to the rack;
   a sliding portion extending from the mounting portion into the rack; and
   a guide coupled to the respective one of the rails, the sliding portion slidingly engaging the guide to move between the first and second positions.

3. The information handling system of claim 2 wherein each adjustable mount further comprises a biasing device coupled to the respective one of the rails and the sliding portion to bias the respective one of the rails against the mounting portion.

4. The information handling system of claim 3 wherein the respective one of the at least one information handling system chassis having the minimum depth equals a depth of the rack and the depth of the respective one of the at least one information handling system chassis having the depth greater than the minimum depth is greater than the minimum depth of the rack.

5. The information handling system of claim 4 further comprising:
   a floating portion coupled to each rail at an end opposite the corresponding one of the adjustable mount, the floating portion providing movement of each rail relative to the rack;
   wherein the biasing device causes the corresponding one of the adjustable mount to respond to the movement of the at least one information handling system chassis before the floating portion.

6. The information handling system of claim 4 further comprising:
   a floating portion coupled to each rail at an end opposite the corresponding one of the adjustable mount, the floating portion providing movement of each rail relative to the rack; and
   a cable manager coupled to the opposing set of the rails and moving with the opposing set of rails relative to each adjustable mount.

7. A method for supporting a plurality of information handling systems in a rack, the method comprising:
   coupling a first information handling system chassis to a first rail;
   coupling a second information handling system chassis to a second rail;
   mounting the first rail in the rack with a first one of an adjustable mount, mounting the second rail in the rack with a second one of the adjustable mount, the rack having a front support and a rear support, each rail mounted to float relative to the front support and the rear support;
   sliding the first information handling system chassis having a first depth from an extended position outside of the rack to a first position in the rack, the first one of the adjustable mount biasing the first rail to maintain a constant position relative to the front support and rear support; and
   sliding the second information handling system chassis having a second depth, the second depth greater than the first depth, the sliding from the extended position outside of the rack to a second position in the rack, the second one of the adjustable mount biasing the rail to maintain a constant position relative to the front support and the rear support as the second information handling system chassis moves from the extended position to the first position and overcoming the biasing to move the rail relative to the front support and rear support as the second information handling system chassis moves from the first position to the second position.

8. The method of claim 7 further comprising biasing the first and second rails toward the front portion of the rack.

9. The method of claim 8 wherein the biasing further comprises coupling a spring to a respective one of the first and second rails and to a respective one of the first one and second one adjustable mount at the front support, each spring biasing the respective one of the first and second rails towards the front support.

10. The method of claim 7 wherein:
    the first information handling system chassis has a length of not greater than the first rail;
    the second information handling system chassis has a length of greater than the second rail; and
    the first and second rails have a same length, the second information handling system chassis sliding to fully insert in the rack to the second position by floating the second rail, the first information handling system chassis sliding to full insert in the rack to the first position without floating the first rail.

11. The method of claim 10 further comprising:
    coupling a cable manager of the second information handling system chassis to the second rail; and
    moving the cable manager with the second rail when the second rail floats.

12. The method of claim 7 wherein mounting each of the first and second rails in the rack further comprises:
    engaging an arm extending from a corresponding one of the adjustable mount in a guide formed in each of the first and second rails.

13. A system for coupling information handling system chassis of different depths to a rack, the system comprising:
    a rail having a housing and a sliding portion, the sliding portion sliding out a front of the housing, the rail floating within the rack;
    an information handling system chassis mount disposed at the sliding portion and operable to couple with one of the information handling system chassis;
    an adjustable mount having a mounting portion operable to couple to a front of the rack, the adjustable mount coupling to the rail, the adjustable mount operable to fully retract the information handling system chassis of the different depths into the rack, the adjustable mount biasing the rail in a first position relative to the rack for fully retracting a first one of the information handling system chassis having a first depth of the different depths, the adjustable mount biasing the rail in the first position for retraction of a second one of the information handling system chassis having a second depth of the different depths to the first depth, the second depth of the different depths being greater than the first depth of the different depths, and overcoming the biasing to move the rail to a second position during further retraction of the second one of the information handling system chassis past the first position to the second position.

14. The system of claim 13 further comprising a floating portion coupled to the housing of the rail and operable to couple to a rear of the rack, the floating portion operable to allow movement of the housing of the rail relative to the rack when the floating portion couples to the rear of the rack.

15. The system of claim 14 further comprising a biasing device operable to bias the rail towards the mounting portion.

16. The system of claim 15 wherein the biasing device comprises a spring coupled to the rail and the adjustable mount.

17. The system of claim 16 further comprising a stop interfaced between the rail and the adjustable mount to limit movement of the rail relative to the adjustable mount.

* * * * *